United States Patent [19]
Jang et al.

[11] Patent Number: 5,702,977
[45] Date of Patent: Dec. 30, 1997

[54] SHALLOW TRENCH ISOLATION METHOD EMPLOYING SELF-ALIGNED AND PLANARIZED TRENCH FILL DIELECTRIC LAYER

[75] Inventors: Syun-Ming Jang, Hsin-Chu; Ying-Ho Chen, Taipei; Chen-Hua Yu, Hsin-Chu, all of Taiwan

[73] Assignee: Taiwan Semiconductor Manufacturing Company, Ltd., Hsin-Chu, Taiwan

[21] Appl. No.: 810,390

[22] Filed: Mar. 3, 1997

[51] Int. Cl.⁶ .................................................. H01L 21/76
[52] U.S. Cl. .......................... 437/67; 437/63; 437/64; 437/238; 437/228; 148/DIG. 50
[58] Field of Search .................................. 437/62, 63, 64, 437/67, 228 TR, 228 POL, 228 ST, 238; 148/DIG. 50

[56] References Cited

U.S. PATENT DOCUMENTS

| | | | |
|---|---|---|---|
| 5,346,584 | 9/1994 | Nasr et al. | 437/67 |
| 5,385,861 | 1/1995 | Bashir et al. | 437/67 |
| 5,420,075 | 5/1995 | Homma et al. | 437/195 |
| 5,459,096 | 10/1995 | Venkatesan et al. | 437/67 |
| 5,472,904 | 12/1995 | Figura et al. | 437/67 |
| 5,492,858 | 2/1996 | Bose et al. | 437/67 |

*Primary Examiner*—Trung Dang
*Attorney, Agent, or Firm*—George O. Saile; Stephen B. Ackerman; Alek P. Szecsy

[57] ABSTRACT

A method for forming within a trench within a substrate within an integrated circuit a planarized trench fill layer. There is first provided a substrate having a trench formed therein. There is formed upon the substrate at regions other than those within the trench a first integrated circuit layer which has a composition which inhibits formation upon the first integrated circuit layer of a trench fill layer which is subsequently formed upon the substrate and within the trench. There is also formed within the trench but not upon the substrate at regions other than those within the trench a second integrated circuit layer which has a composition which promotes formation within the trench of the trench fill layer which is subsequently formed upon the substrate and within the trench. Finally, there is formed upon the substrate and within the trench the trench fill layer. The trench fill layer is formed to a thickness over the trench such that when the trench fill layer is planarized through a chemical mechanical polish (CMP) planarizing method there is avoided formation of a dish within a planarized trench fill layer formed within the trench.

20 Claims, 4 Drawing Sheets

SHALLOW TRENCH ISOLATION METHOD EMPLOYING SELF-ALIGNED AND PLANARIZED TRENCH FILL DIELECTRIC LAYER

BACKGROUND OF THE INVENTION

1. Field of the Invention

The present invention relates generally to methods for filling shallow trenches with trench fill layers within integrated circuits. More particularly, the present invention relates to methods for filling shallow isolation trenches with trench fill dielectric layers within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

As integrated circuit technology has advanced and integrated circuit device dimensions have decreased, it has become increasingly common within advanced integrated circuits to employ trench isolation methods such as shallow trench isolation (STI) methods and recessed oxide isolation (ROI) methods to form trench isolation regions nominally co-planar with adjoining active semiconductor regions of semiconductor substrates. Such trench isolation methods typically employ a chemical mechanical polish (CHIP) planarizing method to provide a nominally planarized surface to a trench fill dielectric layer formed within the trench. Trench isolation regions nominally co-planar with active semiconductor regions within semiconductor substrates are desirable since they optimize, when subsequently forming patterned layers upon those nominally co-planar trench isolation regions and active semiconductor regions, the limited depth of focus typically achievable with advanced photoexposure tooling.

While trench isolation methods employing chemical mechanical polish (CMP) planarizing of trench fill dielectric layers formed into isolation trenches are therefore quite desirable and common in the art of advanced integrated circuit fabrication, such trench isolation methods are nonetheless not entirely without problems. In particular, it is known in the art that trench isolation methods employing chemical mechanical polish (CMP) planarizing of trench fill dielectric layers formed into isolation trenches often, when the isolation trenches are comparatively wide, provide isolation trenches where a planarized trench fill dielectric layer formed therein has dished. The dishing phenomenon is illustrated by reference to the schematic cross-sectional diagrams of FIG. 1 and FIG. 2.

Figure 1:
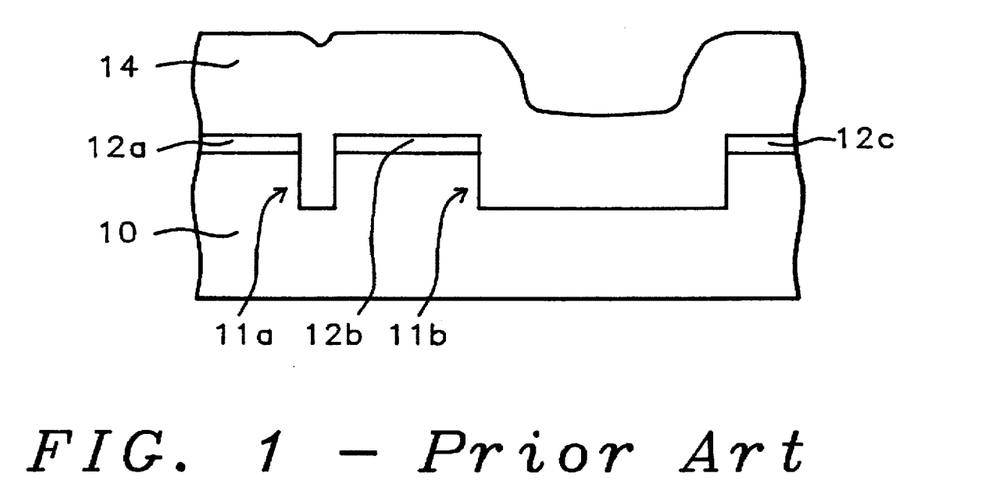
FIG. 1 and FIG. 2 show a pair of schematic cross-sectional diagrams illustrating within a trench within a substrate employed in integrated circuit fabrication dishing of a planarized trench fill layer formed through a chemical mechanical polish (CMP) planarizing method conventional in the art of integrated circuit fabrication.

Shown in FIG. 1 is a substrate 10 having formed therein a narrow trench 11a and a wide trench 11 b. Defining the narrow trench 11a and the wide trench 11b are polish stop layers 12a, 12b and 12c formed upon the surface of the substrate 10. Formed over the substrate 10 and into both the narrow trench 11a and the wide trench 11b is a blanket conformal trench fill layer 14. Shown in FIG. 2 is the results of planarizing through a conventional chemical mechanical polish (CMP) planarizing method the blanket conformal trench fill layer 14 as illustrated in FIG. 1.

Figure 2:
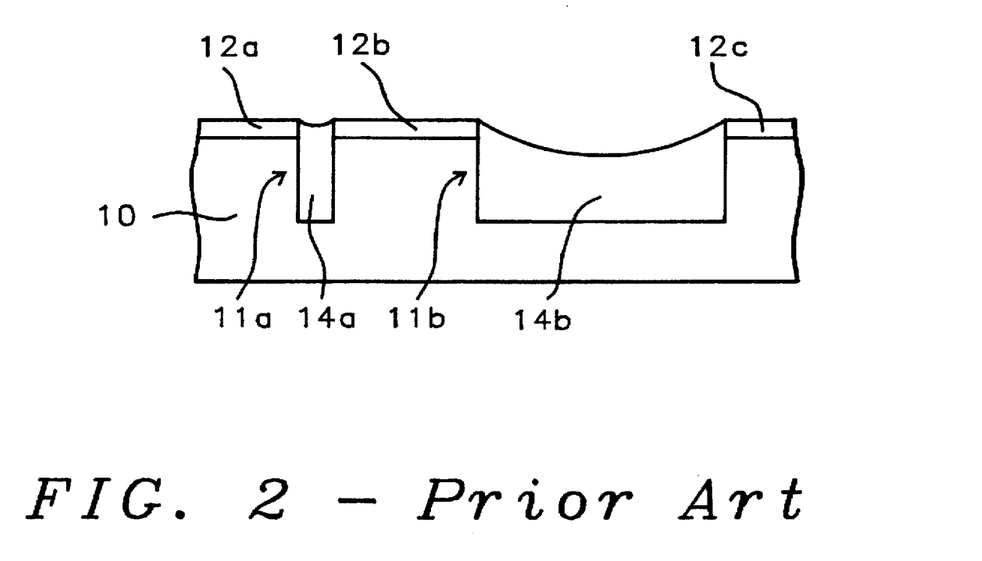

Shown in FIG. 2 are the planarized trench fill layers 14a and 14b formed, respectively, into the narrow trench 11a and the wide trench 11b through the conventional chemical mechanical polish (CMP) planarizing method practiced upon the blanket conformal trench fill layer 14 as illustrated in FIG. 1. As shown in FIG. 2, the surface of the planarized trench fill layer 14b is substantially dished in comparison with the surface of the planarized trench fill layer 14a. Such dishing is common in the art of integrated circuit fabrication since trench fill layers, which are often formed of silicon oxide dielectric materials, are typically softer than polish stop layers, which are typically formed of silicon nitride materials. Such dishing is also common in the art of integrated circuit fabrication when wide trenches, such as the wide trench 11 b, have a width greater than about 0.3 microns (and commonly include wide trenches of widths of greater than about 500 microns), although such dishing is also substantially avoided in the art of integrated circuit fabrication when narrow trenches, such as the narrow trench 11a, have a width of less than about 0.3 microns. Thus, due in part to flexing of a chemical mechanical polish (CMP) polishing pad employed within the chemical mechanical polish (CMP) planarizing method, the planarized trench fill layer 14b is more dished in comparison with the planarized trench fill layer 14a.

Since dishing within planarized trench fill layers formed within trenches within integrated circuits is generally undesirable, it is therefore in general towards forming, without dishing, planarized trench fill layers within trenches within integrated circuits that the present invention is generally directed.

Methods and materials through which layers within integrated circuits may be selectively deposited or processed are known in the art of integrated circuit fabrication. For example, Bashir et al., in U.S. Pat. No. 5,385,681 discloses a fabrication scheme for simultaneously forming a planarized deep trench isolation region and a planarized shallow trench isolation region within a semiconductor substrate. The method employs a patterned polysilicon layer a first portion of which is partially oxidized in forming the planarized deep trench isolation region while a second portion of which is fully oxidized in forming the planarized shallow trench isolation region. In addition, Homma et at., in U.S. Pat. No. 5,420,075 discloses a method for selectively depositing insulator layers into inter-metal spacings within patterned metal layers within integrated circuits. The method provides for treating a portion of a patterned metal layer with a fluorine containing reactive ion etch (RIE) plasma to inhibit formation of a chemical vapor deposited (CVD) silicon oxide layer upon that portion of the patterned metal layer.

Further, Figura et at., in U.S. Pat. No. 5,472,904 disclose a method for simultaneously forming a narrow trench isolation region and a recessed oxide isolation (ROI) region within a semiconductor substrate. The method employs an oxidation barrier formed within a narrow trench within which is formed the narrow trench isolation region but not within a wide trench within which is formed the recessed oxide isolation region. Finally, Bose et at., in U.S. Pat. No. 5,492,858 discloses a method for forming a planarized trench fill dielectric layer within an isolation trench within an integrated circuit. The method employs within the isolation trench a barrier layer which allows for densifying, through steam annealing, a conformal silicon oxide trench fill dielectric layer which may then subsequently be planarized, while avoiding dishing, through a chemical mechanical polish (CMP) planarizing method.

Desirable in the art are additional chemical mechanical polish (CMP) planarizing methods through which there may be avoided dishing of planarized trench fill layers formed within trenches within substrates employed in integrated circuit fabrication. Particularly desirable are additional chemical mechanical polish (CMP) planarizing methods through which there may be avoided dishing of planarized trench fill dielectric layers formed within isolation trenches within semiconductor substrates employed in integrated circuit fabrication. It is towards these goals that the present invention is more specifically directed.

SUMMARY OF THE INVENTION

A first object of the present invention is to provide a chemical mechanical polish (CMP) planarizing method for forming within a trench within a substrate employed within integrated circuit fabrication a planarized trench fill layer.

A second object of the present invention is to provide a method in accord with the first object of the present invention, where there is avoided dishing within the planarized trench fill layer when forming within the trench within the substrate the planarized trench fill layer.

A third object of the present invention is to provide a method in accord with the first object of the present invention and the second object of the present invention, where the trench is an isolation trench and the trench fill layer is a trench fill dielectric layer.

A fourth object of the present invention is to provide a method in accord with the first object of the present invention, the second object of the present invention and the third object of the present invention, which method is readily manufacturable.

In accord with the objects of the present invention, there is provided by the present invention a chemical mechanical polish (CMP) planarizing method for forming a planarized trench fill layer within a trench within a substrate employed within integrated circuit fabrication. To practice the method of the present invention, there is first provided a substrate having a trench formed therein. There is formed upon the substrate at regions other than those within the trench a first integrated circuit layer which has a composition which inhibits formation upon the first integrated circuit layer of a trench fill layer which is subsequently formed upon the substrate and within the trench. There is also formed within the trench but not upon the substrate at regions other than those within the trench a second integrated circuit layer which has a composition which promotes formation upon the second integrated circuit layer of the trench fill layer which is subsequently formed upon the substrate and within the trench. Finally, there is then formed upon the substrate and within the trench the trench fill layer. The trench fill is formed to a thickness over the trench such that when the trench fill layer is planarized through a chemical mechanical polish (CMP) planarizing method there is avoided dishing within a planarized trench fill layer formed within the trench.

There is provided by the present invention a chemical mechanical polish (CMP) planarizing method by which there is formed, while avoiding dishing, a planarized trench fill layer within a trench within a substrate employed in integrated circuit fabrication. By employing within the method of the present invention: (1) a first integrated circuit layer formed upon portions of the substrate other than the trench, where the first integrated circuit layer has a composition which inhibits formation of a trench fill layer subsequently formed upon the substrate and within the trench; and (2) a second integrated circuit layer formed within the trench but not upon portions of the substrate other than the trench, where the second integrated circuit layer has a composition which promotes formation of the trench fill layer subsequently formed upon the substrate and within the trench, there is formed a trench fill layer with a thickness over the trench such that when a planarized trench fill layer is formed within the trench through a chemical mechanical polish (CMP) planarizing method practiced upon the trench fill layer there is avoided dishing within the planarized trench fill layer within the trench.

The method of the present invention may be employed where the trench is an isolation trench and the where the trench fill layer is a trench fill dielectric layer. The method of the present invention does not discriminate with respect to the nature of the trench and the nature of the trench fill layer, provided that: (1) the trench fill layer is susceptible to an inhibited rate of formation when the trench fill layer is formed upon a first integrated circuit layer formed upon portions of the substrate other than the trench; and (2) the trench fill layer is susceptible to an increased rate of formation upon a second integrated circuit layer formed within the trench but not upon portions of the substrate other than the trench. Thus, the method of the present invention may be employed where the trench is an isolation trench and where the trench fill layer is a trench fill dielectric layer.

The method of the present invention is readily manufacturable. A first preferred embodiment of the method of the present invention and a second preferred embodiment of the method of the present invention are disclosed within the Description of the Preferred Embodiments. The first preferred embodiment of the method of the present invention and the second preferred embodiment of the method of the present invention may be practiced through methods as are generally known in the art of integrated circuit fabrication. Thus, the method of the present invention is readily manufacturable.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming, while avoiding dishing, a planarized trench fill layer within a trench within a substrate employed within integrated circuit fabrication. The method of the present invention achieves this goal through: (1) forming upon the substrate at regions other than those within the trench a first integrated circuit layer which inhibits formation upon the first integrated circuit layer of a trench fill layer subsequently formed upon the substrate and within the trench; and (2) forming within the trench but not upon portions of the substrate other than those within the trench a second integrated circuit layer which promotes formation of the trench fill layer subsequently formed upon the substrate and within the trench. The trench fill layer is then formed upon the substrate and within the trench. The trench fill layer is formed to a thickness over the trench which compensates for a dish otherwise formed within a planarized trench fill layer within the trench when the planarized trench fill layer within the trench is formed through planarizing through a chemical mechanical polish (CMP) planarizing method the trench fill layer formed upon the substrate and within the trench. The trench fill layer is then planarized through the chemical mechanical polish (CMP) planarizing method.

Although the preferred embodiment of the method of the present invention discloses the method of the present invention employed in forming, while avoiding dishing, a planarized trench fill dielectric layer within an isolation trench within a semiconductor substrate employed in integrated circuit fabrication, the method of the present invention may also be employed in forming, while avoiding dishing, the planarized trench fill layer of the method of the present invention within trenches other than isolation trenches within substrates other than semiconductor substrates. The method of the present invention may be employed in forming, while avoiding dishing, the planarized trench fill layer of the present invention into trenches within substrates including but not limited to dielectric substrates, semiconductor substrates and conductor substrates. For a general application of the method of the present invention, the width of the trench into which is formed the planarized trench fill layer is preferably greater than about 0.3 microns.

Figure 3:
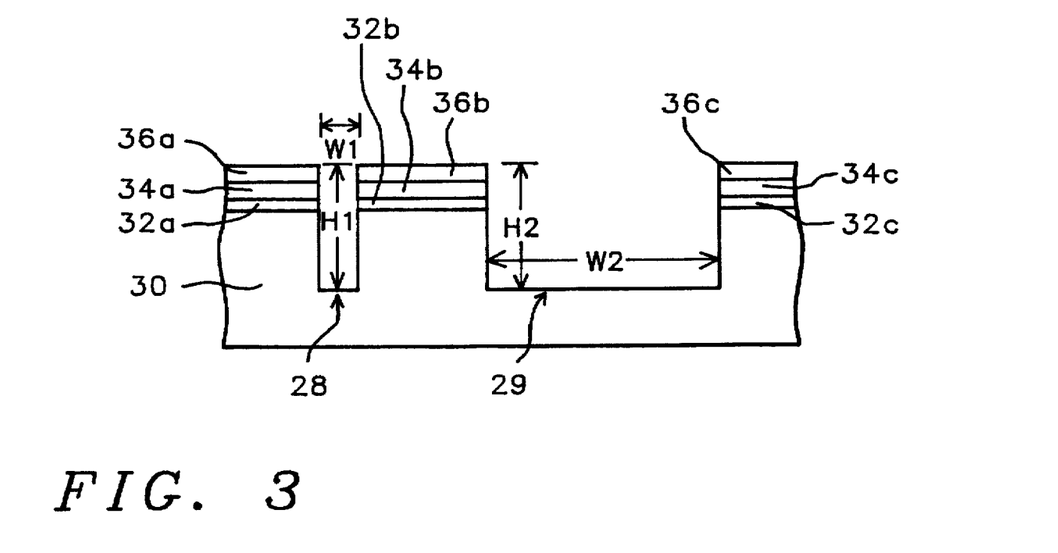
FIG. 3 to FIG. 8 show a series of schematic cross-sectional diagrams illustrating the results of progressive stages in forming within an isolation trench within a semiconductor substrate employed in integrated circuit fabrication a planarized trench fill dielectric layer formed, while avoiding dishing, through a chemical mechanical polish (CMP) planarizing method in accord with the preferred embodiments of the method of the present invention.

Referring now to FIG. 3 to FIG. 8, there is shown a series of schematic cross-sectional diagrams illustrating the results of progressive stages in forming while avoiding dishing, a planarized trench fib dielectric layer within an isolation trench within a semiconductor substrate in accord with the preferred embodiments of the method of the present invention. Shown in FIG. 3 is a schematic cross-sectional diagram illustrating the semiconductor substrate at an early stage in it fabrication.

Shown in FIG. 3 is a semiconductor substrate 30 having formed therein a narrow isolation trench 28 and a wide isolation trench 29, where a planarized trench fill dielectric layer when formed through a chemical mechanical polish (CMP) planarizing method conventional in the art within the wide isolation trench 29 is subject to dishing. Although the preferred embodiments of the method of the present invention may be practiced employing semiconductor substrates of either dopant polarity, any dopant concentration and any crystallographic orientation, the preferred embodiments of the method of the present invention are preferably practiced employing as the semiconductor substrate 30 a (100) silicon semiconductor substrate having an N- or P-doping.

As is illustrated in FIG. 3, the narrow trench 28 within the semiconductor substrate 30 has a width W1 and a height H1, where the width W1 is preferably less than about 0.3 microns while the height H1 is preferably from about 6000 to about 8000 angstroms. Similarly, as is also illustrated in FIG. 3, the wide trench 29 within the semiconductor substrate 30 has a width W2 and a height H2, where the width W2 is preferably greater than about 0.3 microns (and commonly includes widths greater than about 500 microns) and the height H2 is preferably from about 6000 to about 8000 angstroms.

Formed upon the semiconductor substrate 30 and defining the narrow isolation trench 28 and the wide isolation trench 29 is a series of patterned pad oxide layers 32a, 32b and 32c having formed and aligned thereupon a series of patterned silicon nitride layers 34a, 34b and 34c which in turn have formed and aligned thereupon a series of patterned silicon layers 36a, 36b and 36c. Within the preferred embodiment of the method of the present invention, the series of patterned silicon nitride layers 34a, 34b and 34c serves as a series of patterned polish stop layers, while the series of patterned pad oxide layers 32a, 32b and 32c serves as adhesive forming and stress reducing layers between the semiconductor substrate 30 and the series of patterned silicon nitride layers 34a, 34b and 34c. While the series of patterned pad oxide layers 32a, 32b and 32c, and the series of patterned silicon nitride layers 34a, 34b and 34c, are preferably employed within the preferred embodiments of the method of the present invention, they are not required within the present invention. However, their presence provides a means for most uniformly forming within the narrow isolation trench 28 and the wide isolation trench 29 planarized trench fill dielectric layers through the preferred embodiments of the method of the present invention.

The patterned pad oxide layers 32a, 32b and 32c; the patterned silicon nitride layers 34a, 34b and 34c; and the patterned silicon layers 36a, 36b and 36c may be formed through methods as are conventional in the art, which will typically, although not exclusively, employ photolithographic patterning of a blanket pad oxide layer which is formed beneath a corresponding blanket silicon nitride layer which in turn is formed beneath a corresponding blanket silicon layer. The blanket silicon layer, the blanket silicon nitride layer and the blanket pad oxide layer may similarly be formed through methods as are conventional in the art, including but not limited to thermal oxidation methods, chemical vapor deposition (CVD) methods and physical vapor deposition (PVD) sputtering methods, as appropriate. Preferably, the patterned pad oxide layers 32a, 32b and 32c, and the corresponding blanket pad oxide layer, are formed to a thickness of from about 90 to about 130 angstroms each, through a thermal oxidation method. Preferably, the patterned silicon nitride layers 34a, 34b and 34c, and the corresponding blanket silicon nitride layer, are formed to a thickness of from about 1500 to about 2000 angstroms each. Preferably, the patterned silicon layers 36a, 36b and 36b, and the corresponding blanket silicon layer, are formed to a thickness of from about 1000 to about 2000 angstroms each. With respect in particular to the patterned silicon layers 36a, 36b and 36c, the patterned silicon layers 36a, 36b and 36c are preferably formed from either a blanket amorphous silicon layer or a blanket polysilicon layer.

Figure 4:
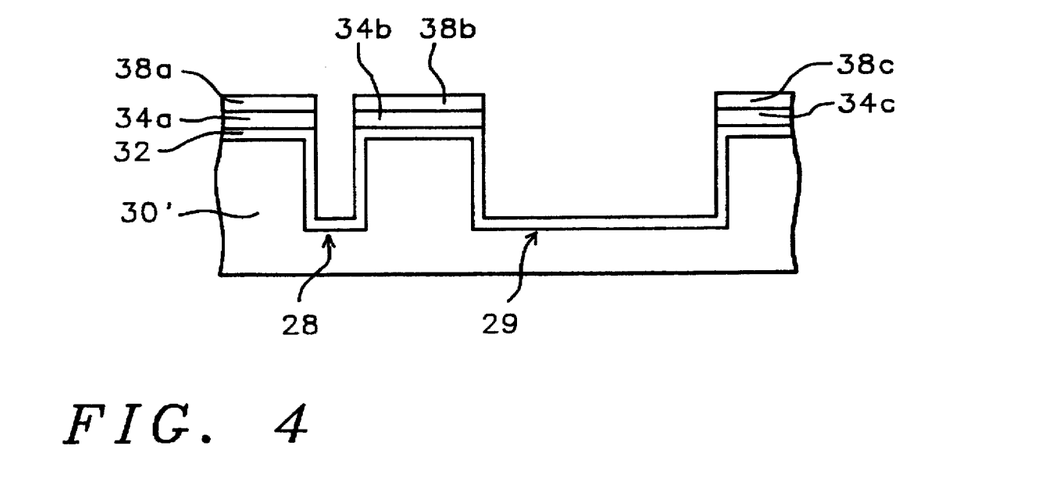

Referring now to FIG. 4, there is shown the results of further processing of the semiconductor substrate 30 whose schematic cross-sectional diagram is illustrated in FIG. 3. Shown in FIG. 4 is the results of thermal oxidation processing of the semiconductor substrate 30 whose schematic cross-sectional diagram is illustrated in FIG. 3. When thermal oxidation processing the semiconductor substrate 30 whose schematic cross-sectional diagram is illustrated in FIG. 3, there is formed: (1) a series of patterned thermal silicon oxide layers 38a, 38b and 38c from the patterned silicon layers 36a, 36b and 36c; (2) a contiguous conformal thermal silicon oxide layer 32 derived from thermal oxidation of the sidewalls and the bottoms of the narrow isolation trench 28 and the wide isolation trench 29, in conjunction with the patterned pad oxide layers 32a, 32b and 32c; and (3) a thermally oxidized semiconductor substrate 30'. Preferably, the semiconductor substrate 30 is thermally oxidized to form: (1) the series of patterned thermal silicon oxide layers 38a, 38b and 38c; (2) the conformal thermal oxide layer 32; and (3) the thermally oxidized semiconductor substrate 30' within an atmosphere comprised of about 100 volume percent oxygen at a flow rate of from about 8 to about 10 standard liters per minute (slm), a temperature of from about 900 to about 1000 degrees centigrade and a pressure of about 760 torr for a time period of from about 20 to about 40 minutes.

As is understood by a person skilled the art, it is alternatively possible within the preferred embodiments of the method of the present invention to form the series of patterned thermal silicon oxide layers 38a, 38b and 38c from a blanket thermal silicon oxide layer which is in turn formed from the blanket silicon layer from which is otherwise formed the patterned silicon layers 36a, 36b and 36c. While such a process sequence ordering requires an additional thermal oxidation processing step, such a process sequence ordering is often preferred within the preferred embodiments of the present invention since the patterned thermal silicon oxide layers 38a, 38b and 38c are preferably formed with different thicknesses in comparison with the conformal thermal silicon oxide layer 32.

Figure 5:
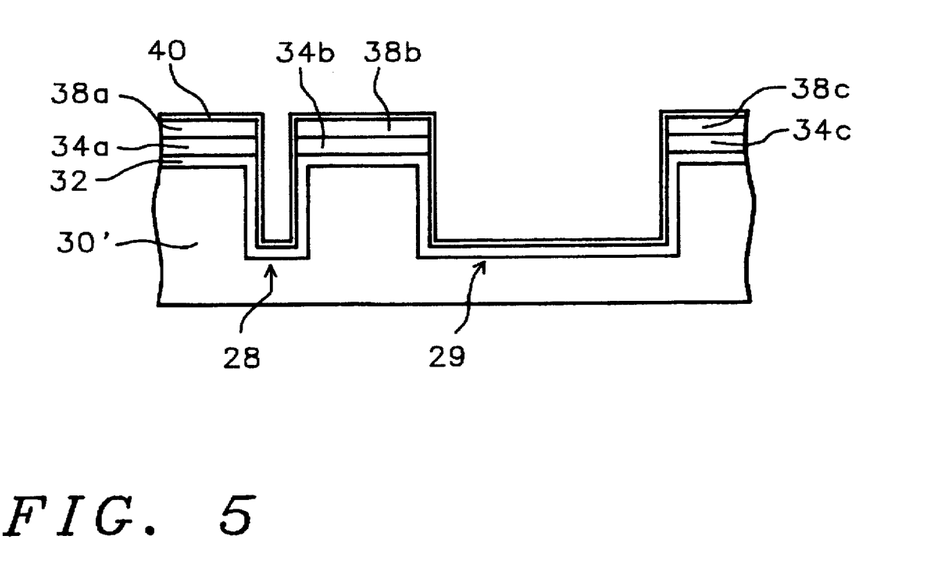

Referring now to FIG. 5, there is shown a schematic cross-sectional diagram illustrating the results of further processing of the thermally oxidized semiconductor substrate 30' whose schematic cross-sectional diagram is illustrated in FIG. 4. Shown in FIG. 5 is a schematic cross-sectional diagram of the thermally oxidized semiconductor substrate 30' otherwise equivalent to the schematic cross-sectional diagram of the thermally oxidized semiconductor substrate 30' whose schematic cross-sectional diagram is illustrated in FIG. 4, but upon whose surface and within the narrow isolation trench 28 and the wide isolation trench 29 has been formed a conformal first ozone assisted thermal chemical vapor deposited (CVD) silicon oxide layer 40. The schematic cross-sectional diagram of the thermally oxidized semiconductor substrate 30' as illustrated in FIG. 5 represents a structure formed in accord with a first preferred embodiment of the method of the present invention. Within the first preferred embodiment of the method of the present invention, it has been found experimentally that the conformal first ozone assisted thermal chemical vapor deposited (CVD) silicon oxide layer 40 is preferably formed employing tetra-ethyl-ortho-silicate (TEOS) as a silicon source material at a comparatively low ozone:TEOS volume ratio, preferably in the range of from about 2:1 to about 4:1.

Other conditions which are employed in forming the conformal first ozone assisted thermal chemical vapor deposited (CVD) silicon oxide layer 40 include: (1) a reactor chamber pressure of from about 40 to about 70 torr (without plasma activation); (2) a substrate temperature of from about 360 to about 440 degrees centigrade; (3) an ozone concentration in an oxygen carrier gas of about 8 weight percent; (4) a tetra-ethyl-ortho-silicate (TEOS) flow rate of from about 200 to about 300 standard cubic centimeters per minute (sccm); (5) an oxygen (ozone carrier gas) flow rate of from about 3000 to about 6000 standard cubic centimeters per minute (sccm); and (6) a helium (tetra-ethyl-ortho-silicate (TEOS) carrier gas) flow rate of from about 1000 to about 1400 standard cubic centimeters per minute (sccm). Preferably, the conformal first ozone assisted thermal chemical vapor deposited (CVD) silicon oxide layer 40 is formed to a thickness of from about 300 to about 800 angstroms.

While FIG. 5 illustrates the thermally oxidized semiconductor substrate 30' incorporating the conformal first ozone assisted thermal chemical vapor deposited (CVD) silicon oxide layer 40 as the structure formed in accord with the first preferred embodiment of the method of the present invention, there also exists a related structure formed in accord with a second preferred embodiment of the method of the present invention. The related structure employs the thermally oxidized semiconductor substrate 30' whose schematic cross-sectional diagram is illustrated in FIG. 4 (ie: absent the conformal first ozone assisted thermal chemical vapor deposited (CVD) silicon oxide layer 40) where the surface has been treated with a nitrogen plasma to: (1) form from nitrogen plasma treatment of the exposed portions of the conformal thermal silicon oxide layer 32 within the narrow isolation trench 28 and the wide isolation trench 29 a conformal partially plasma treated thermal silicon oxide layer; and (2) form from nitrogen plasma treatment of the patterned thermal silicon oxide layers 38a, 38b and 38c a series of plasma treated patterned thermal silicon oxide layers. The nitrogen plasma employed in forming the conformal partially plasma treated thermal silicon oxide layer and the series of plasma treated patterned thermal silicon oxide layers is preferably employed at: (1) a reactor chamber pressure of from about 1 to about 2 torr; (2) a mixed frequency radio frequency power employing about 75 to about 125 watts at a radio frequency of 13.56 MHZ and about 400 to about 500 watts at a radio frequency of 350 kHz; (3) a nitrogen flow rate of from about 400 to about 600 standard cubic centimeters per minute (sccm); and (4) a helium flow rate of from about 1600 to about 2400 standard cubic centimeters per minute (sccm), for a time period of from about 50 to about 70 seconds. A specific schematic cross-sectional diagram illustrating the thermally oxidized semiconductor substrate 30' formed in accord with the second preferred embodiment of the method of the present invention is not included within this description. Other than the presence of: (1) the conformal first ozone assisted thermal chemical vapor deposited (CVD) silicon oxide layer 40; or (2) the alternative foregoing nitrogen plasma treatment in forming the conformal partially plasma treated thermal silicon oxide layer and the series of plasma treated patterned thermal silicon oxide layers, the processing of the semiconductor substrate 30 or the thermally oxidized semiconductor substrate 30' in accord with either the first preferred embodiment of the method of the present invention or the second preferred embodiment of the method of the present invention is otherwise equivalent.

Figure 6:
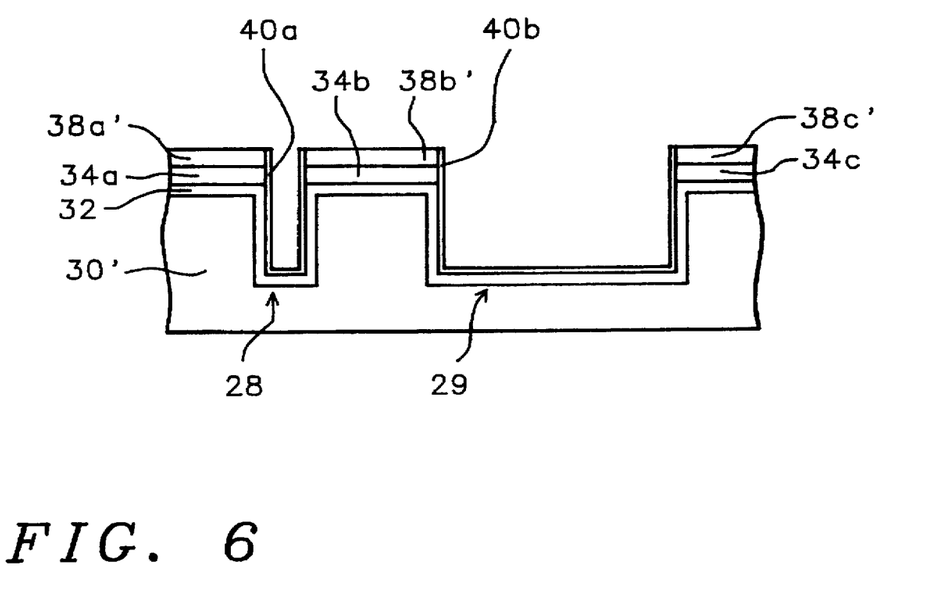

Referring now to FIG. 6, there is shown the results of further processing of the thermally oxidized semiconductor substrate 30' whose schematic cross-sectional diagram is illustrated in FIG. 5. Shown in FIG. 6 is the results of chemical mechanical polish (CMP) planarizing, through a first chemical mechanical polish (CMP) planarizing method, the conformal first ozone assisted thermal chemical vapor deposited (CVD) silicon oxide layer 40 to form the patterned conformal first ozone assisted thermal chemical vapor deposited (CVD) silicon oxide layer 40a within the narrow isolation trench 28 and the patterned conformal first ozone assisted thermal chemical vapor deposited (CVD) silicon oxide layer 40b within the wide isolation trench 29, while simultaneously forming the polished patterned thermal oxide layers 38a', 38b' and 38c'. To assure optimal performance of the first preferred embodiment of the method of the present invention, it is preferred to assure that the polished patterned thermal oxide layers 38a', 38b' and 38c' have fully removed from their surfaces portions of the conformal first ozone assisted thermal chemical vapor deposited (CVD) silicon oxide layer 40 while not penetrating to the patterned silicon nitride layers 34a, 34b and 34c.

The first chemical mechanical polish (CMP) planarizing method is preferably employed at: (1) a platen pressure of from about 6 to about 10 pounds per square inch (psi); (2) a platen rotation speed of from about 40 to about 70 revolutions per minute (rpm); (3) a carrier rotation speed of from about 40 to about 70 revolutions per minute (rpm); (4) an aqueous silica polishing slurry composition of from about 10 to about 20 percent silica by weight; and (5) an aqueous silica polishing slurry flow rate of from about 100 to about 200 cubic centimeters per minute (ccm), for a time period of from about 20 to about 30 seconds.

Although not specifically illustrated in FIG. 6, it has been determined experimentally within the first preferred embodiment of the method of the present invention that the polished patterned thermal oxide layers 38a', 38b' and 38c' inhibit formation of a trench fill dielectric layer subsequently formed upon the thermally oxidized semiconductor substrate 30' and within the narrow isolation trench 28 and the wide isolation trench 29. Similarly, it has also been determined experimentally within the first preferred embodiment of the method of the present invention that the patterned conformal first ozone assisted thermal chemical vapor deposited (CVD) silicon oxide layers 40a and 40b promote formation of the trench fill layer subsequently formed upon the thermally oxidized semiconductor substrate 30' and within the narrow isolation trench 28 and the wide isolation trench 29. Analogously, within the second preferred embodiment of the method of the present invention, it has been determined experimentally that nitrogen plasma treated portions of the conformal thermal silicon oxide layer 32 remaining within the narrow isolation trench 28 and the wide isolation trench 29 after polishing through the first chemical mechanical polish (CMP) planarizing method the nitrogen plasma treated patterned thermal silicon oxide layers 38a, 38b and 38c also promote formation of the trench fill layer subsequently formed upon the thermally oxidized semiconductor substrate 30' and within the narrow isolation trench 28 and the wide isolation trench 29.

Figure 7:
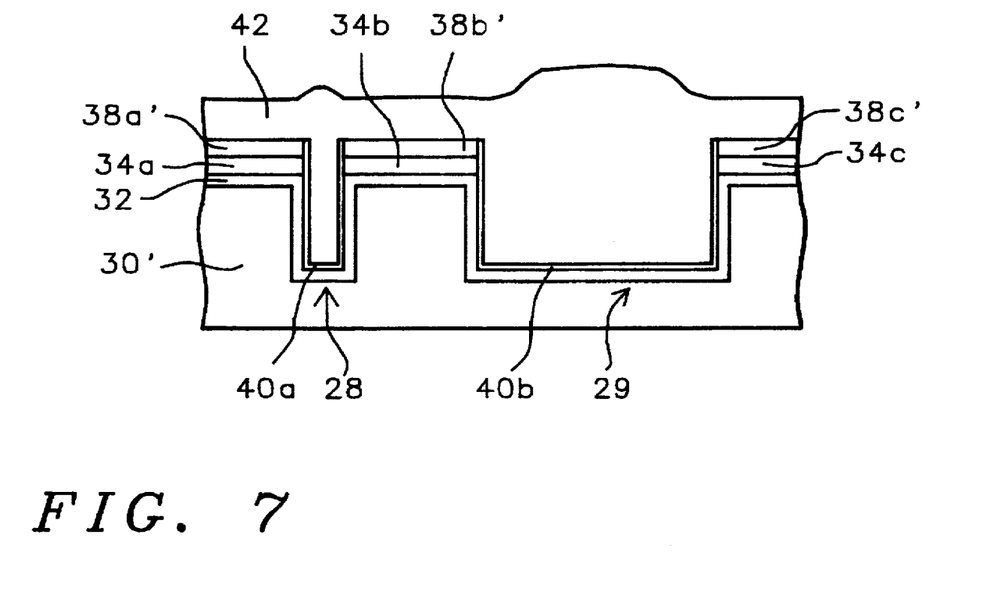

Referring now to FIG. 7, there is shown the remits of further processing of the thermally oxidized semiconductor substrate 30' whose schematic cross-sectional diagram is illustrated in FIG. 6. Shown in FIG. 7 is a schematic cross-sectional diagram of the thermally oxidized semiconductor substrate 30' otherwise equivalent to the schematic cross-sectional diagram of the thermally oxidized semiconductor substrate 30' whose schematic cross-sectional diagram is illustrated in FIG. 6, but upon whose surface and within the narrow isolation trench 28 and the wide isolation trench 29 has been formed a second ozone assisted thermal chemical vapor deposited (CVD) silicon oxide layer 42 which serves as the trench fill dielectric layer. In comparison with the conformal first ozone assisted thermal chemical vapor deposited (CVD) silicon oxide layer 40, the second ozone assisted thermal chemical vapor deposited (CVD) silicon oxide layer 42 is preferably formed at a comparatively higher ozone:TEOS volume ratio, preferably from about 10:1 to about 14:1.

Other conditions employed in forming the second ozone assisted thermal chemical vapor deposited (CVD) silicon oxide layer 42 include: (1) a reactor chamber pressure of from about 450 to about 600 torr (without plasma activation); (2) a substrate temperature of from about 360 to about 440 degrees centigrade; (3) an ozone concentration in an oxygen carrier gas of about 12.5 weight percent; (4) a tetra-ethyl-ortho-silicate (TEOS) flow rate of from about 20 to about 30 standard cubic centimeters per minute (sccm); (5) an oxygen (ozone carrier gas) flow rate of from about 4000 to about 6000 standard cubic centimeters per minute (sccm); and (6) a helium (tetra-ethyl-ortho-silicate (TEOS) carrier gas) flow rate of from about 2000 to about 2600 standard cubic centimeters per minute (sccm).

As is illustrated in FIG. 7, due to the different deposition rates of the second ozone assisted thermal chemical vapor deposited (CVD) silicon oxide layer 42 upon the polished patterned thermal oxide layers 38a', 38b40 and 38c' in comparison with the deposition rate of the second ozone assisted thermal chemical vapor deposited (CVD) silicon oxide layer 42 upon the patterned conformal first ozone assisted thermal chemical vapor deposited (CVD) silicon oxide layer 40a within the narrow isolation trench 28 and the patterned conformal first ozone assisted thermal chemical vapor deposited (CVD) silicon oxide layer 40b within the wide isolation trench 29, the second ozone assisted thermal chemical vapor deposited (CVD) silicon oxide layer is formed to a thickness greater over the narrow isolation trench 28 and the wide isolation trench 29 than over other regions of the thermally oxidized semiconductor substrate 30'. Preferably, the second ozone assisted thermal chemical vapor deposited (CVD) silicon oxide layer 42 is formed to a thickness over the wide isolation trench 29 which compensates for a dish which would otherwise form in a planarized trench fill layer formed from the second ozone assisted thermal chemical vapor deposited (CVD) silicon oxide layer 42 when the second ozone assisted thermal chemical vapor deposited (CVD) silicon oxide layer 42 is planarized through a second chemical mechanical polish (CMP) planarizing method.

Figure 8:
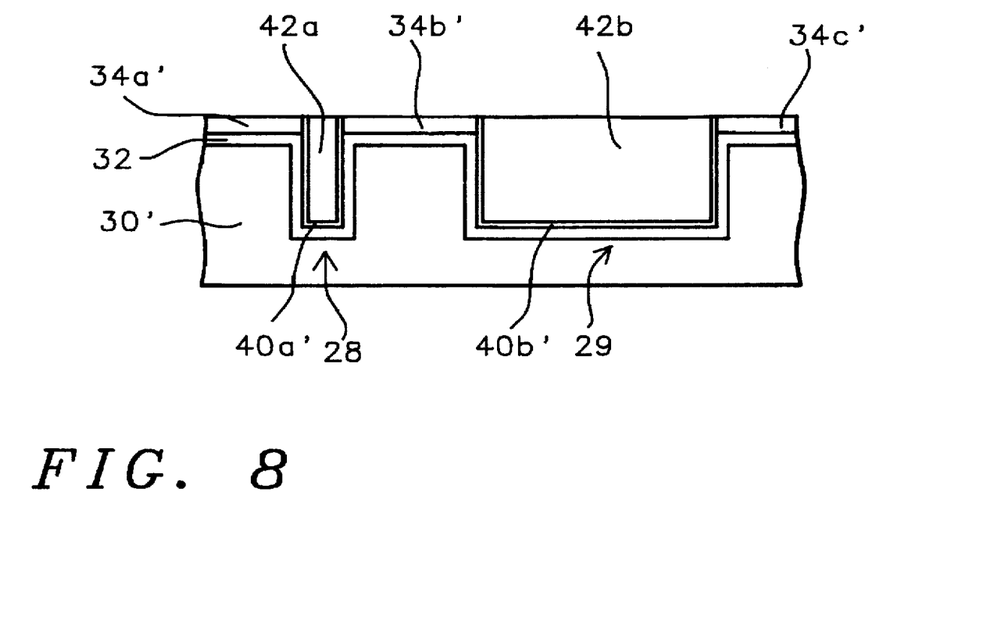

Referring now to FIG. 8, there is shown a schematic cross-sectional diagram illustrating the results of further processing the thermally oxidized semiconductor substrate 30' whose schematic cross-sectional diagram is illustrated in FIG. 7. Shown in FIG. 8 is the thermally oxidized semiconductor substrate 30' as illustrated in FIG. 7, wherein the second ozone assisted thermal chemical vapor deposited (CVD) silicon oxide layer 42 is planarized through the second chemical mechanical polish (CMP) planarizing method to form the patterned planarized second ozone assisted thermal chemical vapor deposited (CVD) silicon oxide layers 42a and 42b. The second chemical mechanical polish (CMP) planarizing method is employed until there is reached the patterned silicon nitride layers 34a, 34b and 34c, thus simultaneously forming a series of polished patterned silicon nitride layers 34a', 34b' and 34c', along with a pair of planarized patterned conformal first ozone assisted thermal chemical vapor deposited (CVD) silicon oxide layers 40a' and 40b'.

Within the first preferred embodiment of the method of the present invention the second chemical mechanical polish (CMP) planarizing method is preferably employed at: (1) a platen pressure of from about 6 to about 10 pounds per square inch (psi); (2) a platen rotation speed of from about 40 to about 70 revolutions per minute (rpm); (3) a carrier rotation speed of from about 40 to about 70 revolutions per minute (rpm); (4) an aqueous silica slurry composition of from about 10 to about 20 weight percent silica; and (5) an aqueous silica slurry flow rate of from about 100 to about 200 cubic centimeters per minute (ccm).

As is illustrated in FIG. 8, the patterned planarized second ozone assisted thermal chemical vapor deposited (CVD) silicon oxide layers 42a and 42b, and in particular the patterned planarized second ozone assisted thermal chemical vapor deposited (CVD) silicon oxide layer 42b formed within the wide isolation trench 29 is formed without dishing which would otherwise occur when forming within wide isolation trenches, such as the wide isolation trench 29, within semiconductor substrates, such as the thermally oxidized semiconductor substrate 30', planarized trench fill layers through chemical mechanical polish (CMP) methods as are conventional in the art of integrated circuit fabrication.

EXAMPLES

A series of four(100) silicon semiconductor substrates was obtained. There was formed upon each silicon semiconductor substrate within the series of four silicon semiconductor substrates a different silicon oxide layer composition.

Upon the first silicon semiconductor substrate there was formed a thermal silicon oxide layer through a thermal oxidation method employing an oxygen ambient at a temperature of about 920 degrees centigrade and a pressure of about 760 torr for a time period of about 30 minutes. The thermal silicon oxide layer so formed was formed to a thickness of about 110 angstroms.

Upon the second silicon semiconductor substrate there was formed a thermal silicon oxide layer otherwise equivalent to the thermal Silicon oxide layer formed upon the first semiconductor substrate, but where the thermal silicon oxide layer was also treated with a nitrogen plasma. The nitrogen plasma was employed at: (1) a reactor chamber pressure of about 1.5 torr; (2) a mixed frequency radio frequency power of about 100 watts at a radio frequency of 13.56 MHZ and a power of about 450 watts at a radio frequency of 350 kHz; (3) a nitrogen flow rate of about 500 standard cubic centimeters per minute (sccm); and (4) a helium flow rate of about 2000 standard cubic centimeters per minute (sccm), for a time period of about 60 seconds.

Upon the third silicon semiconductor substrate there was formed a thermal silicon oxide layer otherwise equivalent to the thermal silicon oxide layer formed upon the first semiconductor substrate, but upon which there was additionally formed a second silicon oxide layer upon the thermal silicon oxide layer. The second silicon oxide layer was formed through an ozone assisted thermal chemical vapor deposition (CVD) method employing tetra-ethyl-ortho-silicate as a silicon source material at a comparatively low ozone:TEOS volume ratio of about 2:1. The method employed: (1) a reactor chamber pressure of about 60 torr (without plasma activation); (2) a substrate temperature of about 400 degrees centigrade; (3) an ozone concentration in an oxygen carrier gas of about 8 weight percent; (4) a tetra-ethyl-ortho-silicate (TEOS) flow rate of about 250 standard cubic centimeters per minute (sccm); (5) an oxygen (ozone carrier gas) flow rate of about 4000 standard cubic centimeters per minute (sccm); and (5) a helium (tetra-ethyl-ortho-silicate (TEOS) carrier gas) flow rate of about 1200 standard cubic centimeters per minute (sccm). The second silicon oxide layer formed through the ozone assisted thermal chemical vapor deposition (CVD) method was formed to a thickness of about 1000 angstroms.

Finally, the fourth silicon semiconductor substrate also had formed thereupon a thermal silicon oxide layer otherwise equivalent to the thermal silicon oxide layer formed upon the first silicon semiconductor substrate, but the fourth silicon semiconductor substrate also had formed thereupon a second silicon oxide layer. The second silicon oxide layer was formed through a plasma enhanced chemical vapor deposition (PECVD) method employing silane as a silicon source material. The plasma enhanced chemical vapor deposition (PECVD) method was employed at: (1) a reactor chamber pressure of about 2.8 torr; (2) a radio frequency power of about 200 watts at a radio frequency of 13.56 MHZ; (3) a substrate temperature of about 400 degrees centigrade; (4) a silane flow rate of about 80 standard cubic centimeters per minute (sccm); and (5) a nitrous oxide (N2O) oxidizing gas flow rate of about 1800 standard cubic centimeters per minute. The second silicon oxide layer formed through the plasma enhanced chemical vapor deposition (PECVD) method was formed to a thickness of about 500 angstroms.

Upon each of the silicon semiconductor substrates was then formed a third silicon oxide layer formed through a second ozone assisted thermal chemical vapor deposition (CVD) method employing tetra-ethyl-ortho-silicate (TEOS) as a silicon source material at a comparatively high ozone-:TEOS volume ratio of about 12:1. The second ozone assisted thermal chemical vapor deposition (CVD) method employed: (1) a reactor chamber pressure of about 450 torr (without plasma activation); (2) a substrate temperature of about 400 degrees centigrade; (3) an ozone concentration in an oxygen carrier gas of about 12.5 weight percent; (4) a tetra-ethyl-ortho-silicate (TEOS) flow rate of about 25 standard cubic centimeters per minute (sccm); (5) an oxygen (ozone carrier gas) flow rate of about 5000 standard cubic centimeters per minute (sccm); and (6) a helium (tetra-ethyl-ortho-silicate (TEOS) carrier gas) flow rate of about 2300 standard cubic centimeters per minute (sccm). The third silicon oxide layers formed through the second ozone assisted thermal chemical vapor deposition (CVD) method were formed upon each of the four silicon semiconductor substrates for a time period of about 3 minutes.

The thicknesses of the four third silicon oxide layers formed through the second ozone assisted chemical vapor deposition (CVD) method were then measured through techniques as are conventional in the art. The measured thicknesses of the four third silicon oxide layers formed through the second ozone assisted chemical vapor deposition (CVD) method are reported in Table I, normalized to the deposition time in order to provide growth rates.

TABLE I

| Example | Silicon Oxide Underlayer(s) | O3-TEOS Layer Growth Rate |
| --- | --- | --- |
| 1 | thermal oxide | 120 angstroms/min. |
| 2 | thermal oxide + nitrogen plasma | 1530 |
| 3 | thermal oxide + low O3-TEOS oxide | 1670 |
| 4 | thermal oxide + PECVD oxide | 1600 |

From review of the data in Table I it is seen that there exists a substantial difference in deposition rates for the third silicon oxide layers formed through the second ozone assisted thermal chemical vapor deposition (CVD) method upon the various silicon oxide underlayers formed upon the four silicon semiconductor substrates. These differences in deposition rates provide the basis for the first preferred embodiment of the method of the present invention and the second preferred embodiment of the method of the present invention.

Similarly, although included within neither the first preferred embodiment of the present invention nor the second preferred embodiment of the present invention, a silicon oxide underlayer formed, in accord with example 4, through a plasma enhanced chemical vapor deposition (PECVD) method employing silane as a silicon source material serves approximately as well in promoting formation thereupon of a third silicon oxide layer formed through the second ozone assisted thermal chemical vapor deposition (CVD) method as the silicon oxide underlayers formed in accord with examples 2 and 3. For this reason, the silicon oxide underlayers as listed in example 4 provide an operative, although not necessarily preferred, embodiment of the present invention. It is estimated that parameter variations of at least about ±20 percent within the parameters employed in forming the plasma enhanced chemical vapor deposited (PECVD) silicon oxide layer within the silicon oxide underlayers employed within example 4 will also provide operable, although not necessarily preferred, embodiments of the present invention.

As is understood by a person skilled in the art, the preferred embodiments and examples of the present invention are illustrative of the present invention rather than limiting of the present invention. Revisions and modifications may be made to methods, materials, structures and dimensions through which is provided the preferred embodiments and examples of the present invention while still providing embodiments and examples which are within the spirit and scope of the present invention, as defined by the appended claims.

What is claimed is:

1. A method for forming and planarizing a trench fill layer within a trench within an integrated circuit comprising:

providing a substrate, the substrate having a trench formed therein;

forming upon the substrate at regions other than those within the trench a first integrated circuit layer, the first integrated circuit layer having a composition which inhibits formation upon the first integrated circuit layer of a trench fill layer which is subsequently formed upon the substrate and within the trench;

forming within the trench but not upon the substrate at regions other than those within the trench a second integrated circuit layer, the second integrated circuit layer having a composition which promotes formation within the trench of the trench fill layer which is subsequently formed upon the substrate and within the trench; and forming upon the substrate and within the trench the trench fill layer, the trench fill layer being formed to a thickness over the trench such that when the trench fill layer is planarized through a chemical mechanical polish (CMP) planarizing method there is avoided formation of a dish within a planarized trench fill layer formed within the trench.

2. The method of claim 1 wherein the substrate is selected from the group of substrates consisting of dielectric substrates, semiconductor substrates and conductor substrates.

3. The method of claim 1 wherein the trench has a width greater than about 0.3 microns.

4. The method of claim 1 wherein the trench fill layer is a silicon oxide trench fill layer formed through an ozone assisted thermal chemical vapor deposition (CVD) method employing tetra-ethyl-ortho-silicate (TEOS) as a silicon source material at an ozone:TEOS volume ratio of from about 10:1 to about 14:1 and a reactor chamber pressure of from about 450 to about 600 torr (without plasma activation).

5. The method of claim 4 wherein the first integrated circuit layer is a silicon oxide insulator layer formed through a thermal oxidation method.

6. The method of claim 4 wherein the second integrated circuit layer is a silicon oxide insulator layer formed through a thermal oxidation method and subsequently treated with a nitrogen plasma.

7. The method of claim 6 wherein the nitrogen plasma is employed at:

a reactor chamber pressure of from about 1 to about 2 torr;

a mixed frequency radio frequency power of about 75 to about 125 watts at a radio frequency of 13.56 MHZ and about 400 to about 500 watts at a radio frequency of 350 kHz; and an exposure time of from about 50 to about 70 seconds.

8. The method of claim 4 wherein the second integrated circuit layer is a silicon oxide insulator layer formed through an ozone assisted thermal chemical vapor deposition (CVD) method employing tetra-ethyl-ortho-silicate (TEOS) as a silicon source material at an ozone:TEOS volume ratio of about 2:1 to about 4:1 and a reactor chamber pressure of from about 40 to about 70 torr (without plasma activation).

9. The method of claim 4 wherein the second integrated circuit layer is a silicon oxide integrated circuit layer formed through a plasma enhanced chemical vapor deposition (PECVD) employing silane as a silicon source material.

10. The method of claim 9 wherein the plasma enhanced chemical vapor deposition method also employs a nitrous oxide oxidant and a radio frequency power of from about 160 to about 240 watts at a radio frequency of 13.56 MHZ.

11. A method for forming and planarizing a trench fill dielectric layer within an isolation trench within an integrated circuit comprising:

providing a substrate, the substrate having an isolation trench formed therein;

forming upon the substrate at regions other than those within the isolation trench a first integrated circuit layer, the first integrated circuit layer having a composition which inhibits formation upon the first integrated circuit layer of a trench fill dielectric layer which is subsequently formed upon the substrate and within the isolation trench;

forming within the isolation trench but not upon the substrate at regions other than those within the isolation trench a second integrated circuit layer, the second integrated circuit layer having a composition which promotes formation within the isolation trench of the trench fill dielectric layer which is subsequently formed upon the substrate and within the isolation trench; and forming upon the substrate and within the isolation trench the trench fill dielectric layer, the trench fill dielectric layer being formed to a thickness over the isolation trench such that when the trench fill dielectric layer is planarized through a chemical mechanical polish (CMP) planarizing method there is avoided formation of a dish within a planarized trench fill dielectric layer formed within the isolation trench.

12. The method of claim 11 wherein the substrate is a semiconductor substrate.

13. The method of claim 11 wherein the isolation trench has a width greater than about 0.3 microns.

14. The method of claim 11 wherein the trench fill dielectric layer is a silicon oxide trench fill dielectric layer formed through an ozone assisted thermal chemical vapor deposition (CVD) method employing tetra-ethyl-ortho-silicate (TEOS) as a silicon source material at an ozone:TEOS volume ratio of from about 10:1 to about 14:1 and a reactor chamber pressure of from about 450 to about 600 torr (without plasma activation).

15. The method of claim 14 wherein the first integrated circuit layer is a silicon oxide insulator layer formed through a thermal oxidation method.

16. The method of claim 14 wherein the second integrated circuit layer is a silicon oxide insulator layer formed through a thermal oxidation method and subsequently treated with a nitrogen plasma.

17. The method of claim 16 wherein the nitrogen plasma is employed at:

a reactor chamber pressure of from about 1 to about 2 torr;

a mixed frequency radio frequency power of about 75 to about 125 watts at a radio frequency of 13.56 MHZ and about 400 to about 500 watts at a radio frequency of 350 kHz; and an exposure time of from about 50 to about 70 seconds.

18. The method of claim 14 wherein the second integrated circuit layer is a silicon oxide insulator layer formed through an ozone assisted thermal chemical vapor deposition (CVD) method employing tetra-ethyl-ortho-silicate (TEOS) as a silicon source material at an ozone:TEOS volume ratio of about 2:1 to about 4:1 and a reactor chamber pressure of from about 40 to about 70 torr (without plasma activation).

19. The method of claim 14 wherein the second integrated circuit layer is a silicon oxide integrated circuit layer formed through a plasma enhanced chemical vapor deposition (PECVD) employing silane as a silicon source material.

20. The method of claim 19 wherein the plasma enhanced chemical vapor deposition method also employs a nitrous oxide oxidant and a radio frequency power of from about 160 to about 240 watts at a radio frequency of 13.56 MHZ.

* * * * *